(12) United States Patent
Rasnick et al.

(10) Patent No.: US 8,992,722 B2
(45) Date of Patent: Mar. 31, 2015

(54) DIRECT DRIVE ARRANGEMENT TO CONTROL CONFINEMENT RINGS POSITIONING AND METHODS THEREOF

(75) Inventors: John W. Rasnick, Los Gatos, CA (US); Fred D. Egley, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 1155 days.

(21) Appl. No.: 12/552,233

(22) Filed: Sep. 1, 2009

(65) Prior Publication Data

US 2011/0054661 A1    Mar. 3, 2011

(51) Int. Cl.
  *C23C 16/00*    (2006.01)
  *C23F 1/00*    (2006.01)
  *H01J 37/32*    (2006.01)

(52) U.S. Cl.
  CPC ..... *H01J 37/32642* (2013.01); *H01J 37/32623* (2013.01)
  USPC .............. 156/345.26; 118/723 E; 156/345.47

(58) Field of Classification Search
  CPC .................. C23C 16/45517; C23C 16/45557; C23C 16/52; H01J 37/32623; H01J 37/32642
  USPC .................. 118/715–733; 156/345.1–345.55
  See application file for complete search history.

(56) References Cited

U.S. PATENT DOCUMENTS

| | | | |
|---|---|---|---|
| 5,646,733 A * | 7/1997 | Bieman | 356/604 |
| 5,796,066 A * | 8/1998 | Guyot | 219/121.48 |
| 6,019,060 A * | 2/2000 | Lenz | 118/723 R |
| 6,350,317 B1 | 2/2002 | Hao et al. | |
| 6,726,799 B2 * | 4/2004 | Koike | 156/345.24 |
| 7,364,623 B2 * | 4/2008 | Cirigliano | 118/715 |
| 8,313,612 B2 * | 11/2012 | McMillin et al. | 156/345.54 |
| 2003/0151371 A1 | 8/2003 | Fischer et al. | |
| 2005/0263070 A1 * | 12/2005 | Fink | 118/715 |
| 2007/0284045 A1 | 12/2007 | Fischer et al. | |
| 2008/0149595 A1 | 6/2008 | Cirigliano | |

OTHER PUBLICATIONS

"International Search Report", PCT Application No. PCT/US2010/046788, Mailing Date: Apr. 20, 2011.
"Written Opinion", PCT Application No. PCT/US2010/046788, Mailing Date: Apr. 20, 2011.
"International Preliminary Report on Patentability", PCT Application No. PCT/US2010/046788, Mailing Date: Mar. 15, 2012.

\* cited by examiner

*Primary Examiner* — Rakesh Dhingra
*Assistant Examiner* — Benjamin Kendall
(74) *Attorney, Agent, or Firm* — Beyer Law Group LLP

(57) ABSTRACT

A direct drive arrangement for controlling pressure volume within a confinement region of a processing chamber of a plasma processing system during substrate processing is provided. The confinement region is a chamber volume surrounded by confinement rings is provided. The arrangement includes plunger assemblies configured for changing the pressure of motor assemblies configured for vertically moving the plunger assemblies, and recording set point position values for the plunger assemblies. The arrangement further includes a set of circuits configured for driving the motor assemblies to move the plunger assemblies to change the pressure volume within the confinement region. The set of circuits is also configured for providing power to the motor assemblies. The set of circuits is further configured for receiving the set point position values from the motor assemblies.

8 Claims, 11 Drawing Sheets

DIRECT DRIVE ARRANGEMENT TO CONTROL CONFINEMENT RINGS POSITIONING AND METHODS THEREOF

BACKGROUND OF THE INVENTION

Advances in plasma processing have provided for growth in the semiconductor industry. To be competitive in the semiconductor industry, a manufacturing company needs to be able to minimize waste during substrate processing. Accordingly, maintaining tight control of the process parameters during substrate processing is essential for reducing waste and producing high quality semiconductor devices.

In a plasma processing system, plasma is formed above a substrate to perform substrate processing. In order to control plasma formation and to protect the process chamber walls, confinement rings may be employed. Typically, the confinement rings are configured to surround the periphery of the chamber volume in which plasma is to form.

The confinement rings may include multiple rings stacked on top of one another. The gap between the confinement rings may be adjusted to control the volume of pressure within the confined area. In other words during substrate processing, if the chamber pressure is outside of the designated range (such as that determined by the current recipe), the confinement rings may be adjusted. In an example, to increase the pressure within the processing chamber, the gap between the confinement rings may be reduced.

Accordingly, an arrangement for controlling the movement of the confinement rings is desirable in order to maintain tight control of the pressure parameter during substrate processing.

BRIEF SUMMARY OF THE INVENTION

The invention relates, in an embodiment, to a direct drive arrangement for controlling pressure volume within a confinement region of a processing chamber of a plasma processing system during substrate processing, wherein the confinement region is a chamber volume surrounded by a set of confinement rings. The arrangement includes a plurality of plunger assemblies configured for changing the pressure volume by vertically moving the set of confinement rings. The arrangement also includes a plurality of motor assemblies configured for vertically moving the plurality of plunger assemblies, and recording a plurality of set point position values for the plurality of plunger assemblies. The arrangement further includes a set of circuits configured at least for driving the plurality of motor assemblies to move the plurality of plunger assemblies to change the pressure volume within the confinement region. The set of circuits is also configured for providing power to the plurality of motor assemblies to move the plurality of plunger assemblies. The set of circuits is further configured for receiving the plurality of set point position values from the plurality of motor assemblies.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following Figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

As aforementioned, plasma is employed to etch a substrate into semiconductor devices. Those skilled in the arts are aware that a stable plasma is important during substrate processing. Thus, the ability to maintain tight control of the process parameters during substrate processing is essential for plasma stability. When the process parameters are outside of a narrow, pre-defined window, the process parameters may have to be adjusted to maintain the stable plasma.

The pressure within the processing chamber is a process parameter that can cause the plasma formed above the substrate to become unstable if left unmonitored. Consider the situation wherein, for example, a substrate is being processed within a processing chamber of a plasma processing system. The substrate is disposed on top of a lower electrode (such as an electrostatic chuck). During substrate processing, plasma is formed above the substrate to perform etching. Surrounding, the plasma are confinement rings. The confinement rings may be employed to confine the plasma within a fixed area and to control the pressure within the confinement region. The gap between the confinement rings may be adjusted to control the volume of pressure on the substrate surface.

Figure 1:
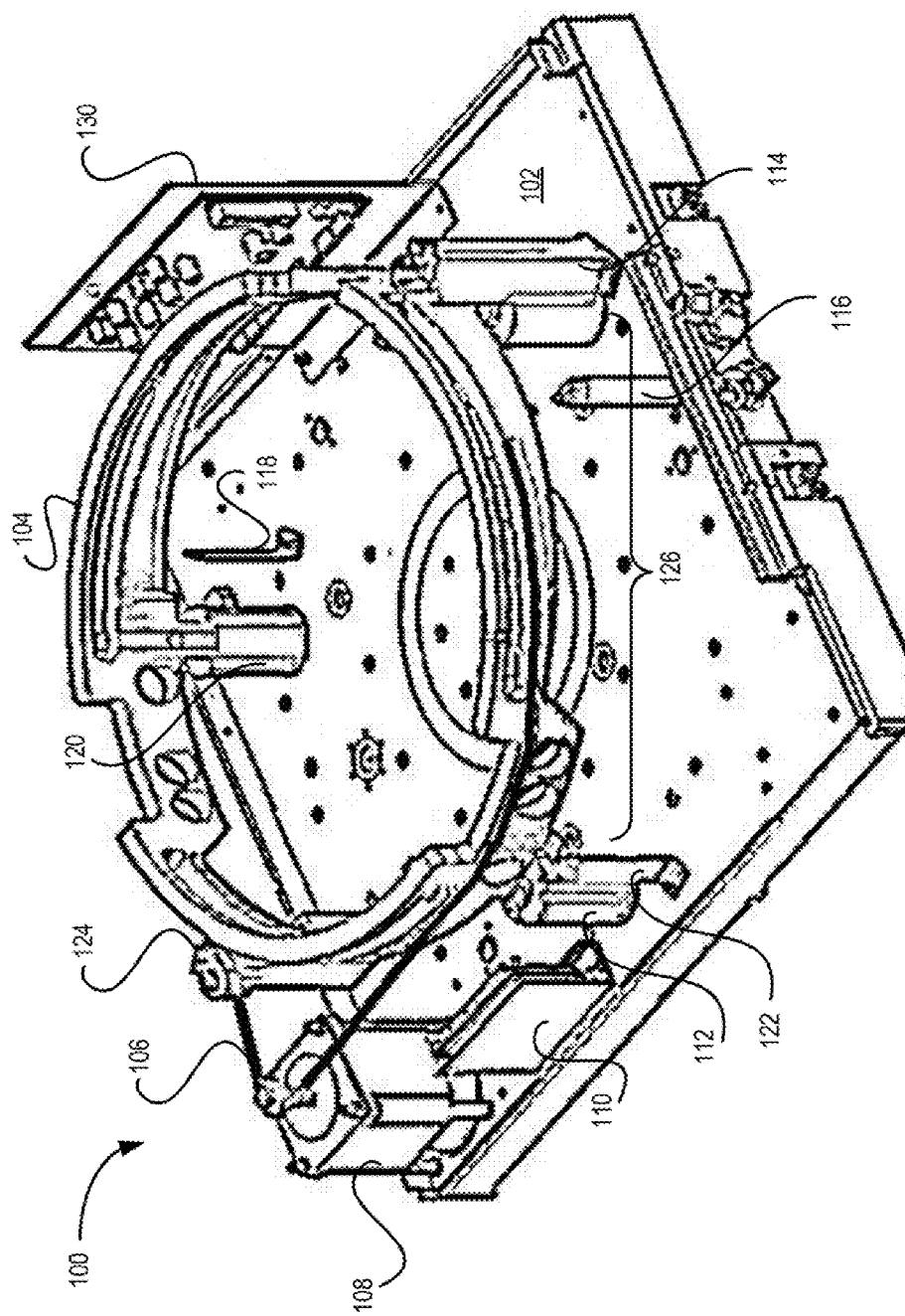
FIG. 1 shows a simple diagram of a CAM ring arrangement on top of a top plate.

To move the confinement rings, a CAM ring arrangement may be provided in the prior art. FIG. 1 shows a simple diagram of a prior art CAM ring arrangement 100 on top of a top plate 102. CAM ring arrangement 100 may include a CAM ring 104, which is attached to a single stepper motor 108 via a belt 106. A tensioning arrangement 124 may be available to provide the tension as single stepper motor 108 moves belt 106, thereby causing CAM ring 104 to rotate. Given the amount of power that may be required to move the CAM ring arrangement, single stepper motor 108 may be a fairly large motor, such as a five-phase motor.

CAM ring arrangement 100 may also include a set of plungers, such as plungers 112, 114, and 120. Each plunger is attached to CAM ring 104 via a wheel arrangement, such as a ball-bearing wheel arrangement (not shown). As CAM ring 104 rotates, the set of plungers (112, 114, and 120) is moved up and down to adjust the gap between the confinement rings.

CAM ring 104 is divided into CAM regions (such as a CAM region 126), wherein each CAM region is associated with each plunger. In an example, if CAM ring arrangement 100 includes three plungers, then there are three CAM regions. The top-plate-facing side of each CAM region has a wedge shape. As CAM ring 104 rotates, the depth a plunger travels is controlled by the contour of each CAM region. Thus, the angle of CAM ring 104 at each CAM region determines the vertical distance traveled by each plunger.

Before substrate processing begins, CAM ring arrangement 100 is first placed into an initialization position. The initialization position is set based on the pressure setting of a recipe. Those skilled in the art are aware that a recipe for a process module may be entered via a user interface computer (such as a cluster tool controller). The recipe is then sent to the process module controller. The process module controller performs an algorithm to determine the initial set point value for each of the plungers. The initial set point value is then sent to a two-axis stepper board 130, which then sends the instructions to a motor driver board 110. Due to the size of CAM ring arrangement 100, two boards (boards 110 and 130) are usually required to control the activity of the CAM ring arrangement since stepper board 130 does not have the power to drive the motor directly. Upon receiving the instructions, motor driver board 110 may power single 5-phased stepper motor 108, thereby causing CAM ring 104 to rotate and the plungers to be moved in a vertical direction (that is up/down). CAM ring arrangement 100 may include an optical sensor 122, which is employed to set each plunger at the initial set point value (such as the home position). A mechanical stop (such as 116 and 118) may be employed to provide a hard stop if optical sensor 122 fails to perform properly.

During substrate processing, a sensor, such as a manometer (not shown), is employed to measure the pressure within the processing chamber. The measurement is sent back to the process module controller. If the pressure has changed, the process module controller performs an algorithm to determine the new set point value. The process module controller then sends the instructions, which include the direction of the vertical movement of the plunger and the step position, to stepper board 130. The instruction is then relayed to motor driver board 110, which activates stepper motor 108, which in turn rotates CAM ring 104 and move the plungers to the new set point value. To accurately determine the position of each plunger, a linear encoder 114 may be employed. The value of the new set point position value of each plunger may then be sent back to the process control module. The new set point position value is available as a point of reference when a new set point value needs to be calculated.

Given that top plate 102 has limited physical space, manufacturers continue to seek new ways to reduce the number of components on the top plate without sacrificing functionality. In accordance with embodiments of the present invention, a direct drive arrangement and methods thereof are provided. Embodiments of the invention include a direct drive arrangement that is configured to perform pressure control while occupying less physical space on the top plate of a plasma processing system. Embodiments of the invention also include methods for calibrating and initializing the direct drive arrangement. Further, embodiments of the invention include methods for controlling pressure during substrate processing.

In an embodiment of the invention, a direct drive arrangement is provided for controlling the pressure volume within the processing chamber. Unlike the prior art CAM ring arrangement, the direct drive arrangement requires fewer mechanical/electrical components to control the pressure environment within the confinement region. In an embodiment, the direct drive arrangement includes a set of plunger arrangements in communication with a circuit board.

Each plunger arrangement includes a plunger shaft that is hooked to the upper confinement ring of the set of confinement rings surrounding the periphery of the chamber volume in which plasma is to form. In the prior art CAM ring arrangement, a complex assembly (CAM ring, belt, tensioning arrangement, wheel arrangement, motor, etc.) is required to move a plunger shaft. In contrast, in the direct drive arrangement, the plunger shaft is directly connected to the motor shaft.

In the prior art CAM ring arrangement, the potential distance traveled by each plunger shaft may be determined by the wedge shape of the CAM ring in each of the CAM region. Unlike the prior art, the potential distance a plunger shaft may travel may be determined by a pair of sensors, which is positioned on the plunger arrangement. The gap between the pair of sensors provides the maximum distance the plunger shaft may travel. By repositioning the pair of sensors, the maximum distance a plunger shaft may travel may be changed.

In an embodiment, a flag (such as a mechanical flag) may be affixed to the plunger shaft. As the plunger shaft is moved in a vertical direction (up and down), the flag may travel between the two sensors. When the flag on the plunger shaft breaks the optical beam of either sensor, the sensor prevents the plunger shaft from continuing to move in the same direction. In an example, the plunger shaft is prevented from moving downward once the flag has broken the optical beam of the second sensor. As discussed refer the first sensor refers to an up sensor or a home sensor and the second sensor refers to the down sensor or far sensor.

In the prior art CAM ring arrangement, the CAM ring assembly is controlled by a large motor (such as a 5-phase motor). Unlike the prior art, the motor of the direct drive arrangement is positioned on top of the plunger assembly. Also, the motor shaft is directly connected to the plunger shaft. Since each plunger assembly is associated with its own individual motor, the motor may be a smaller motor (such as a 2-phase motor). Since the motor is positioned on top of the plunger assembly, the motor does not take up additional physical space on the top plate.

By simplifying the design of the direct drive arrangement, fewer mechanical components are required to perform the function of controlling pressure within the confinement region. As a result, the space previously occupied by the CAM ring assembly is made available for other functions. Since there are fewer mechanical/electrical components, the direct drive arrangement is more reliable and the cost of maintaining and servicing the direct drive arrangement is less expensive.

The features and advantages of the present invention may be better understood with reference to the figures and discussions that follow.

Figure 2:
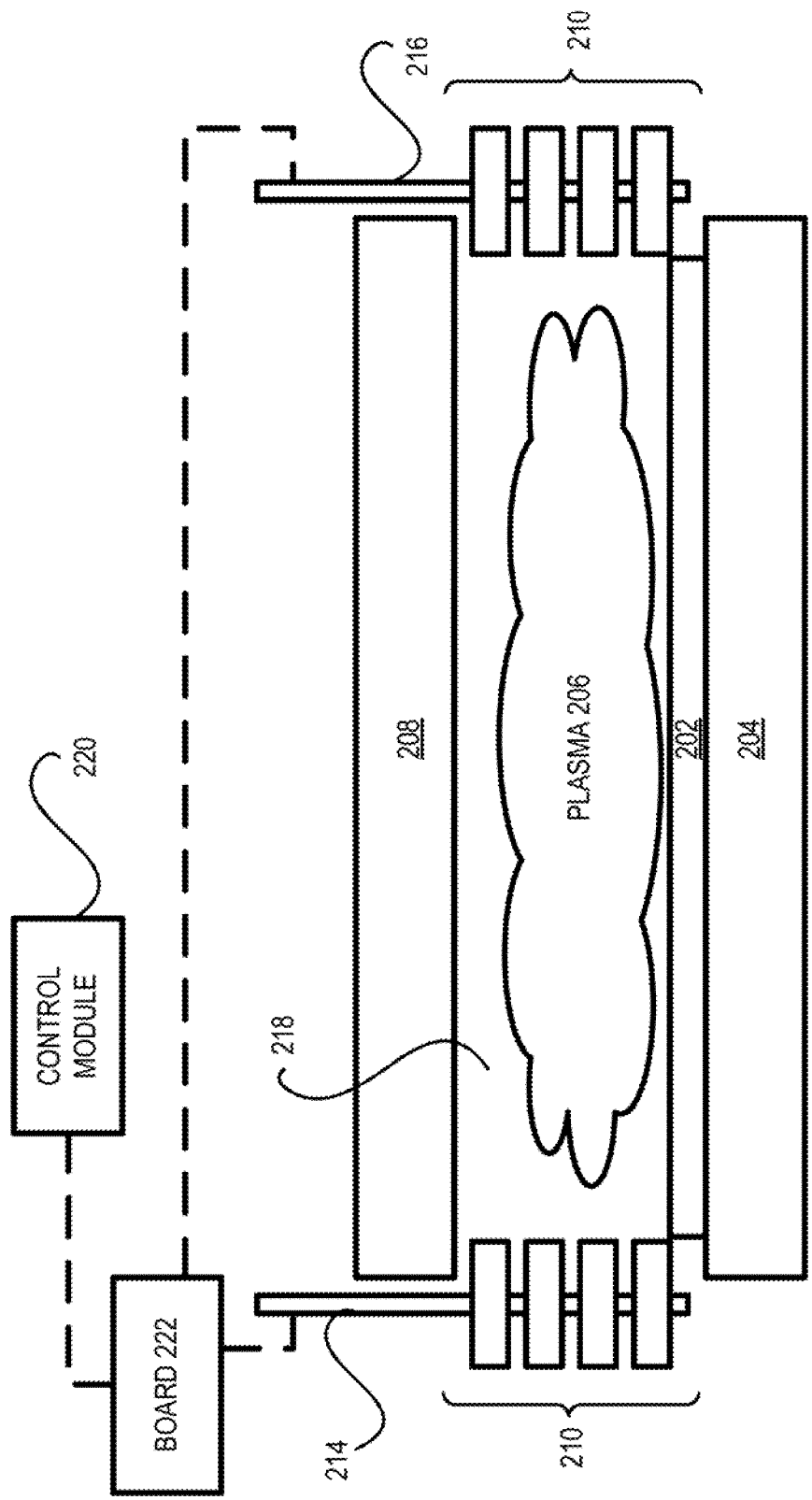
FIG. 2 shows, in an embodiment, a simple cross-sectional diagram of a direct drive arrangement within a processing chamber.

FIG. 2 shows, in an embodiment, a simple cross-sectional diagram of a direct drive arrangement within a processing chamber. Consider the situation wherein, for example, a substrate 202 is disposed on top of a lower electrode 204. To process substrate 202 during production, a plasma 206 may form between substrate 202 and upper electrode 208. In some processing chambers, confinement rings 210 may be employed to confine plasma 206.

In a typical processing chamber that employs confinement rings 210, the confinement rings may have attachment points. In the prior art, the CAM ring arrangement may include a vacuum sealed plunger shaft positioned at each of the attachment points. Similarly, the direct drive arrangement includes a plunger arrangement (such as 214 and 216, for example) at each of the attachment points. In an embodiment, each plunger arrangement may include a plunger shaft coupled to a motor via a motor shaft. A more detailed discussion of the plunger arrangement will be discussed in FIGS. 4A, 4B, 4C, and 4D. In an embodiment, the number of plunger arrangements may correlate directly with the number of attachment points.

To control the volume of pressure within confinement region 218, the plunger shaft of each plunger arrangement may be moved vertically (up/down) to adjust the gaps between the confinement rings, thereby controlling the amount of pressure within the processing chamber. In the prior art CAM ring arrangement, a motor rotates a CAM ring arrangement, thereby causing the plunger shaft to move up and down. Unlike the prior art, the motor of each plunger arrangement moves the plunger shaft without having to first rotate a CAM ring arrangement.

The plunger shafts may be moved in response to processing data (such as pressure data) collected by a set of sensors, such as manometers (not shown). The processing data may be sent to a control module 220 via a board 222 for analysis. If the processing data traverses a threshold range, instructions may be sent to board 222, which may then drives each motor (not shown) to move each plunger shaft vertically in order to change the pressure volume within confinement region 218. In an example, if the processing data indicates that the pressure level is below the pre-defined threshold, the gap between the confinement rings may be adjusted to correct the pressure level within confinement region 218.

As discussed herein, the term traverse may include exceed, fall bellow, be within range, and the like. The meaning of the word traverse may depend upon the requirement of the threshold value/range. In an example, if the recipe requires the pressure value, for example, to be at least a certain value, then the processing data is considered to have traversed the threshold value/range if the pressure value has met or exceed the threshold value/range. In another example, if the recipe requires the pressure value, for example, to be below a value, then the processing data has traversed the threshold value/range if the pressure value has fallen below the threshold value/range.

Figure 3:
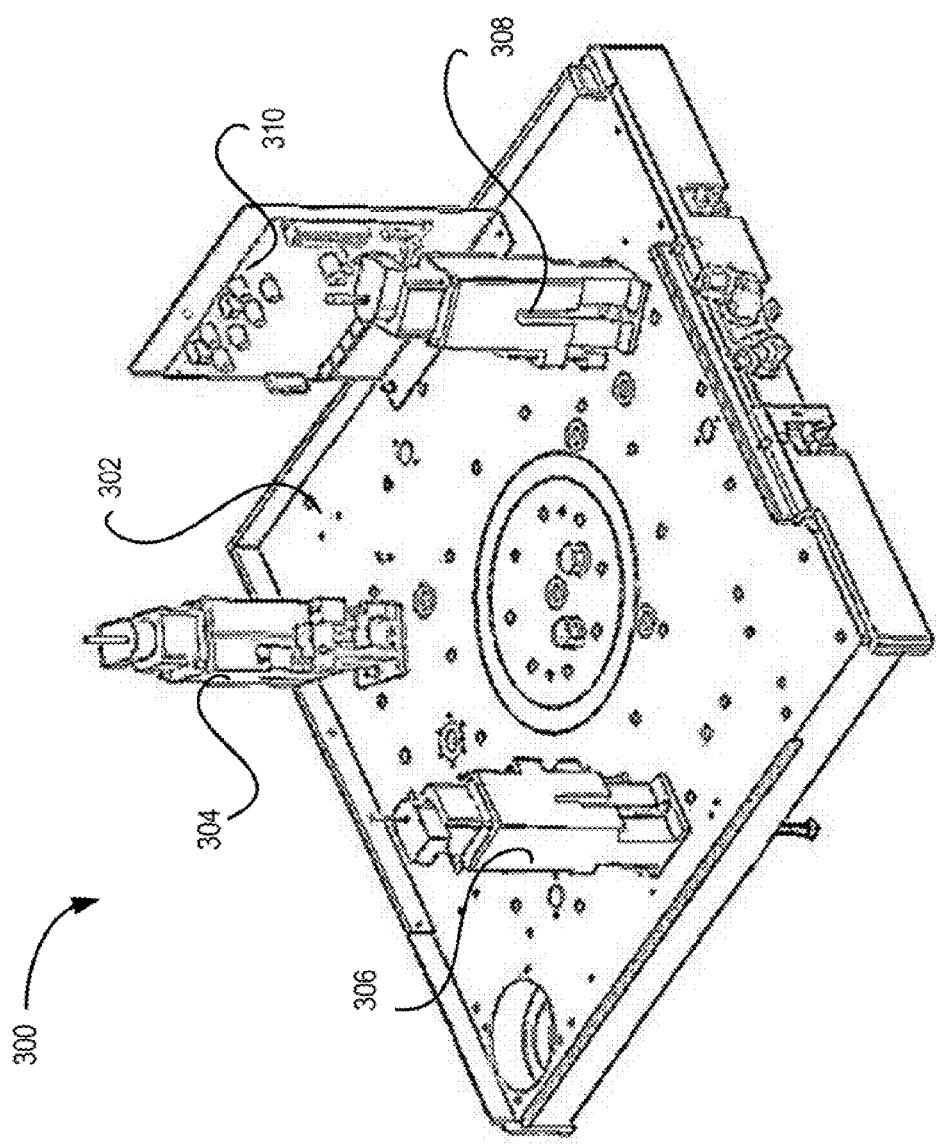
FIG. 3 shows, in an embodiment of the invention a simple diagram of a direct drive arrangement on a top plate.

FIG. 3 shows, in an embodiment of the invention, a simple diagram of a direct drive arrangement 300 on a top plate 302. Direct drive arrangement 300 includes a set of plunger arrangements (304, 306, and 308) and a circuit board 310, such as a printed circuit board (PCB). Unlike the prior art, no additional mechanical/electrical components are required to manage the pressure volume within the confinement rings. As can be appreciated from the foregoing, direct drive arrangement 300 is a simple and compact arrangement that occupies less physical space on top plate 302 than the prior art CAM ring arrangement. In other words, many of the mechanical/electrical parts that may have been required in the prior art CAM ring arrangement have become superfluous in direct drive arrangement 300 and have been eliminated. For example, direct drive arrangement 300 does not need the CAM ring, the belt, the tensioning arrangement, or even the second circuit board (such as the motor driver board) to perform the function of managing pressure within the confinement area. As can be appreciated from the foregoing, although a preferred embodiment includes one circuit board, the direct drive arrangement may also be implemented with more than one circuit board if desired.

By eliminating both mechanical and electrical components, more physical space on top plate 302 is available to support other functions. In addition, with fewer mechanical/electrical components, there are fewer parts to support, thereby reducing the service and component costs. Also, with fewer mechanical/electrical parts, more control over movement is provided and less vibration is produced when the adjustment is made, thereby enabling better control over the pressure range and better resolution. In addition, with fewer mechanical components, fewer particles are generated when the mechanical components come in contact with one another in order to move the set of plunger shafts in a vertical direction (up and down). Since particles can contaminate the substrate in the processing chamber, fewer particles being generated provides a cleaner production environment.

Figure 4A:
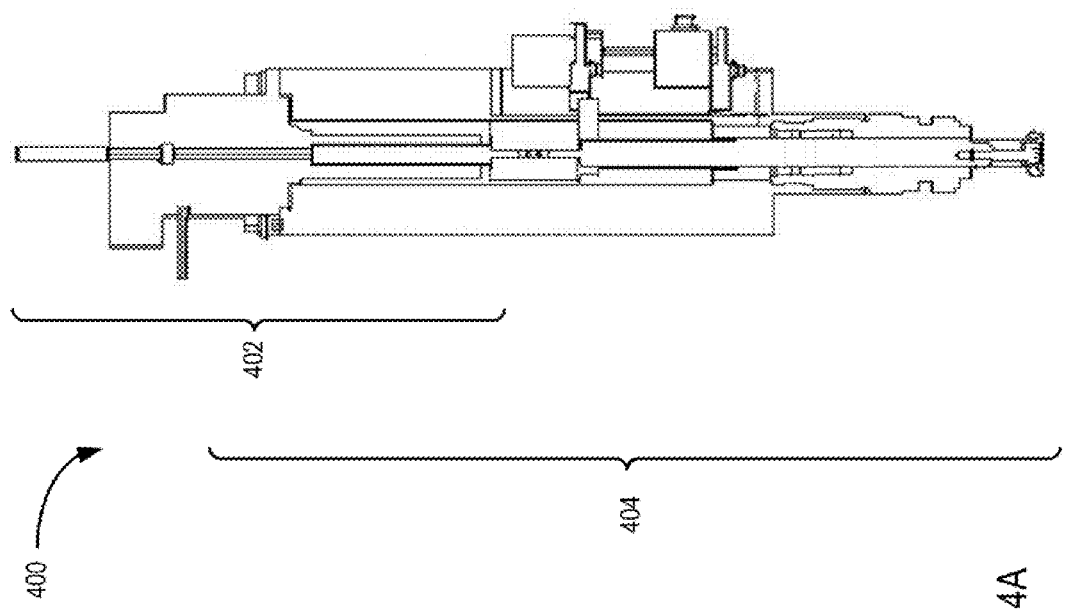
FIGS. 4A, 4B, 4C and 4D show, in embodiments of the invention, different views of a plunger arrangement.

FIGS. 4A, 4B, 4C, and 4D show, in embodiments of the invention, different views of a plunger arrangement 400. FIG. 4A shows, in an embodiment of the invention, a cross-sectional view of a plunger arrangement 400. Plunger arrangement 400 may include a motor assembly 402 and a plunger assembly 404.

Figure 4B:
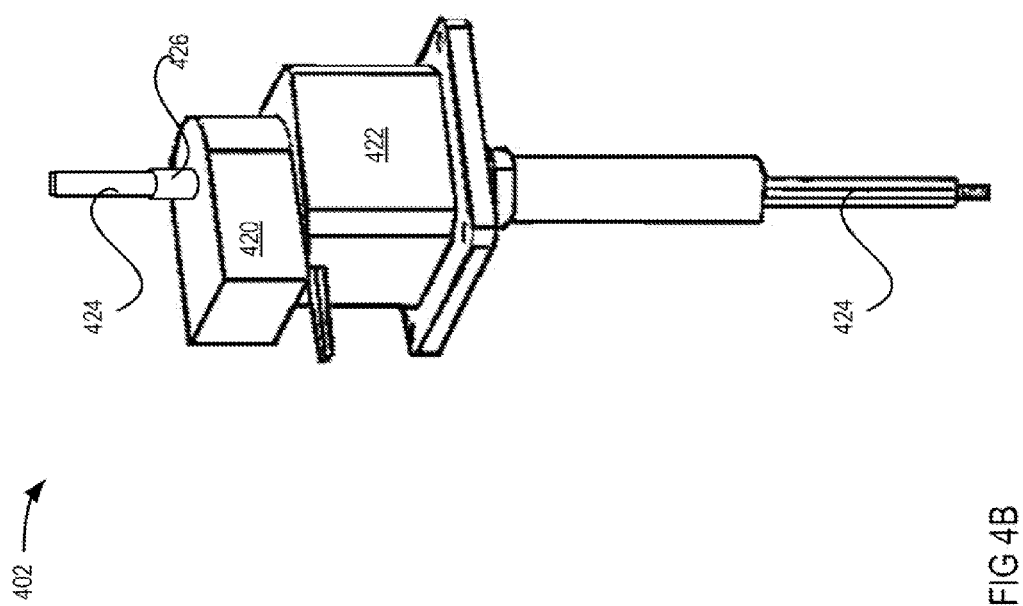

Motor assembly 402, as shown in FIG. 4B, includes an encoder 420 disposed above a motor 422, in an embodiment. In an embodiment, motor 422 is a 2-phase stepper motor. Unlike the prior art CAM ring arrangement, motor 422 is a much smaller motor. In the prior art CAM ring arrangement, a larger motor (such as a 5-phase stepper motor) is required to support the various plungers and the CAM ring assembly. However, in the direct drive arrangement, each plunger arrangement is associated with its own motor; therefore, the motor may be a smaller motor since the motor is required to support less components. Although the motors are small, the motors are capable of lifting/holding more than twice the weight of the set of confinement rings, in an embodiment. Thus, if power is lost during the time when a robot arm is either placing/removing, a substrate in/into the processing chamber, the set of confinement rings is not accidentally dropped onto the substrate and/or robot arm, thereby damaging the substrate and/or robot arm.

In an embodiment, encoder 420 is configured to record the set point position value of the plunger shaft. The set point position value is relayed to the circuit board, which then forwards the data to a control module. The set point position value is stored and utilized to calculate a new set point position value for the plunger shall when the pressure level within the confinement region is outside of the threshold range, which may be predetermined.

Figure 4C:
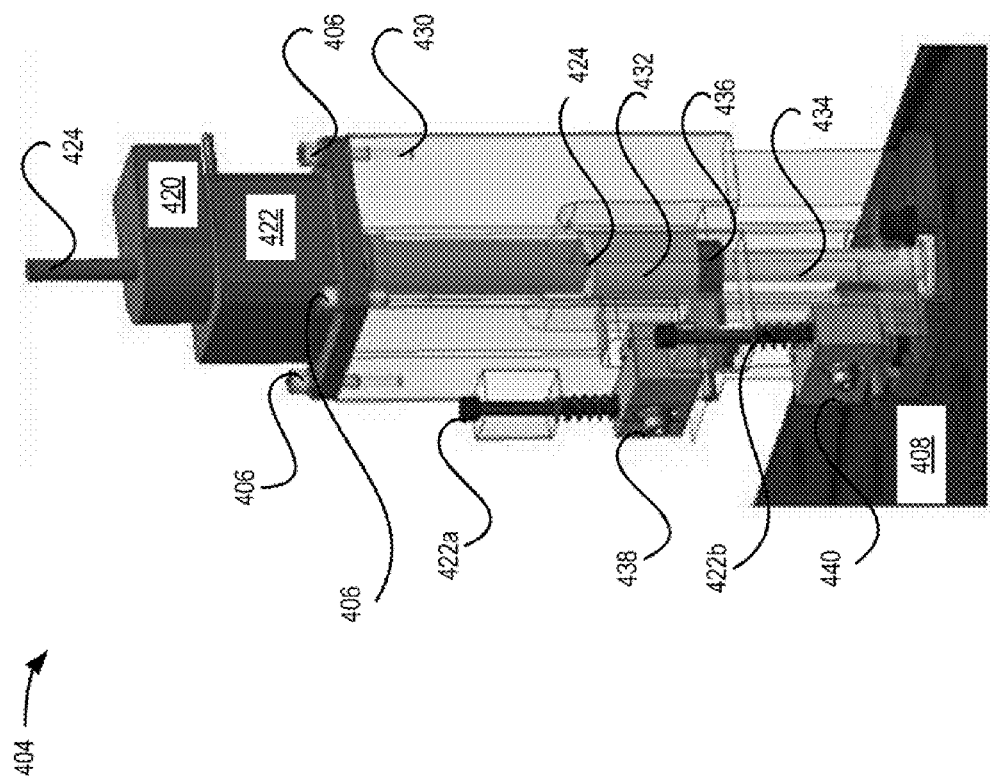

Connecting encoder 420 to motor 422 is a motor shaft 424. Motor shaft 424 may extend from the motor assembly into the upper part of plunger assembly 404, as shown in FIG. 4C. FIG. 4C shows, in an embodiment of the invention, a cross-sectional view of the body of plunger assembly 404. The body of plunger assembly 404 is the part of plunger assembly 404 that is positioned above a top plate 408.

Plunger assembly 404 may include a housing 430, wherein the housing 430 is coupled to motor 422 via coupling elements 406. Within housing 430 is a coupler 432, which is configured to connect to motor shaft 424 on one end and to a plunger shaft 434 on the opposite end. Directly below coupler 432 is a flag 436. In an embodiment, flag 436 encircles part of plunger shaft 434 and is attached to plunger 434 via a set screw (not shown). By attaching flag 436 directly onto plunger shaft 434, the flag is at a fixed position in relation to plunger shaft 434. In other words, flag 436 moves with plunger shaft 434.

Plunger assembly 404 may also include a first sensor 438 (also known as a home sensor) and a second sensor 440 (also known as a far sensor). The maximum gap between the sensors (438 and 440) provides the maximum distance by which plunger shaft 434 may move vertically (up/down) when plunger shaft 434 is employed to adjust the confinement rings surrounding the plasma. In an embodiment, the maximum gap between the sensors (438 and 440) may be adjusted by manually rotating the set screws (such as screw 422a and screw 422b). In an embodiment, the set screws are employed to set the sensors at a fixed position.

In another embodiment, the sensors (438 and 440) are attached to a fixed block, wherein second sensor 440 is at a fixed position and the position of first sensor 438 is adjustable. In other words, instead of adjusting both set screws to adjust the gap between the sensors, only screw 422a (associated with first sensor 438) is required to be adjusted.

In an embodiment, flag 436 is configured to travel between the two sensors (438 and 440). Before substrate processing, flag 436 is set to a home position by plunger shaft 434 upward until flag 436 breaks the optical beam of first sensor 438. A further discussion about initialization and calibration is provided in a later discussion.

Although flag 436 is configured to travel the distance between the two sensors, an alarm may be sent, in an embodiment, if flag 436 breaks the optical beam of second sensor 440. In other words, second sensor 440 may be set at a position such that if flag 436 breaks the optical beam of second sensor 440, the production environment within the region of the confinement rings may be at a pressurized level that may not be acceptable for substrate processing.

Figure 4D:
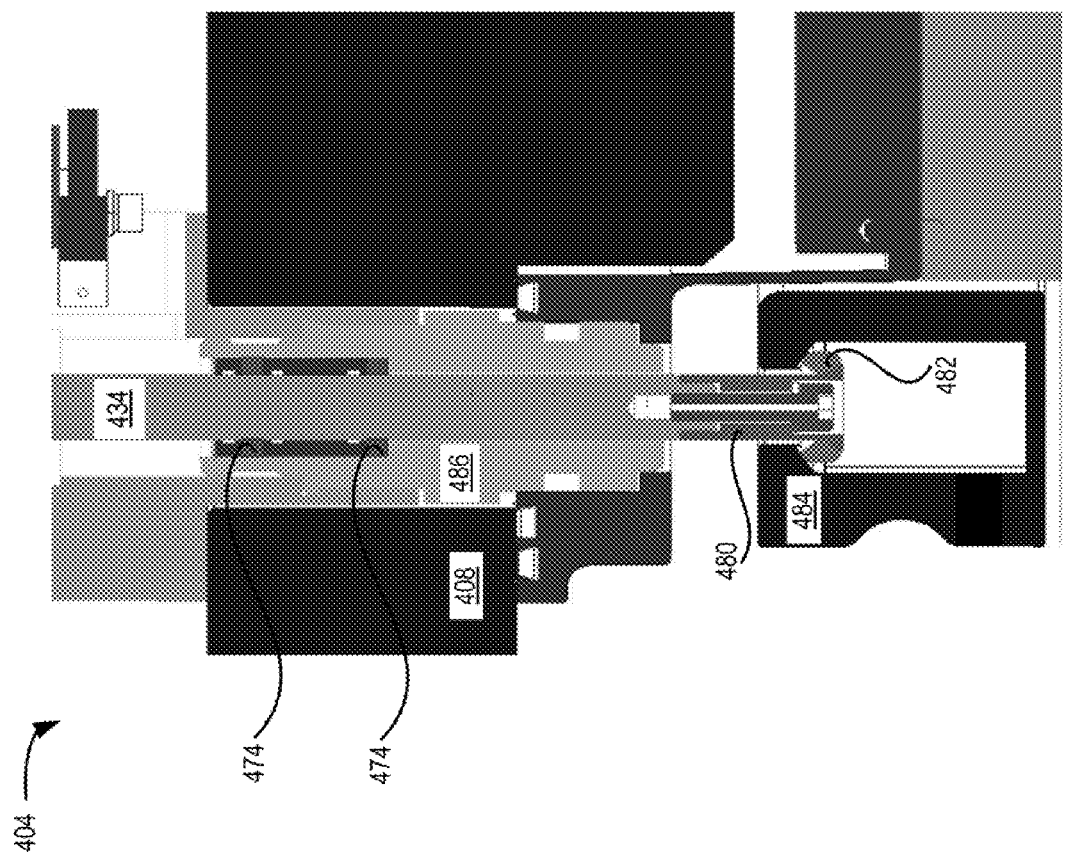

Plunger assembly 404 may also include in an embodiment, a nose-end portion, as shown in FIG. 4D. The nose-end portion is positioned below the top surface of top plate 408. The nose-end portion of plunger assembly 404 also includes a shaft-end adapter 480 coupled to plunger shaft 434. Shaft-end adapter 480 may include a ring adapter 482, which is configured to lock onto the set of confinement rings 484 to enable the set of confinement rings 484 to be moved when plunger shaft 434 is moved vertically (up/down).

Those skilled in tile art are aware that the region above top plate 408 is in an atmospheric environment while the area below top plate 408 is in a vacuumed environment. To seal off the vacuumed environment from the atmospheric environment, a bushing component 486 and a set of seals 474 (such as quad seals, o-rings, and the like) may be employed to seal off the pressure difference between the two environments. In an embodiment, bushing component 486 may also be employed to guide plunger shaft 434 as plunger shaft 434 moves in a vertical direction (up/down). In other words, the usage of bushing component 486 to keep plunger shaft 434 straight (i.e., prevent from wobbling) minimizes the potential of the set of confinement rings from shaking and creating an uncontrolled substrate processing environment and causing particles generation.

Figure 5:
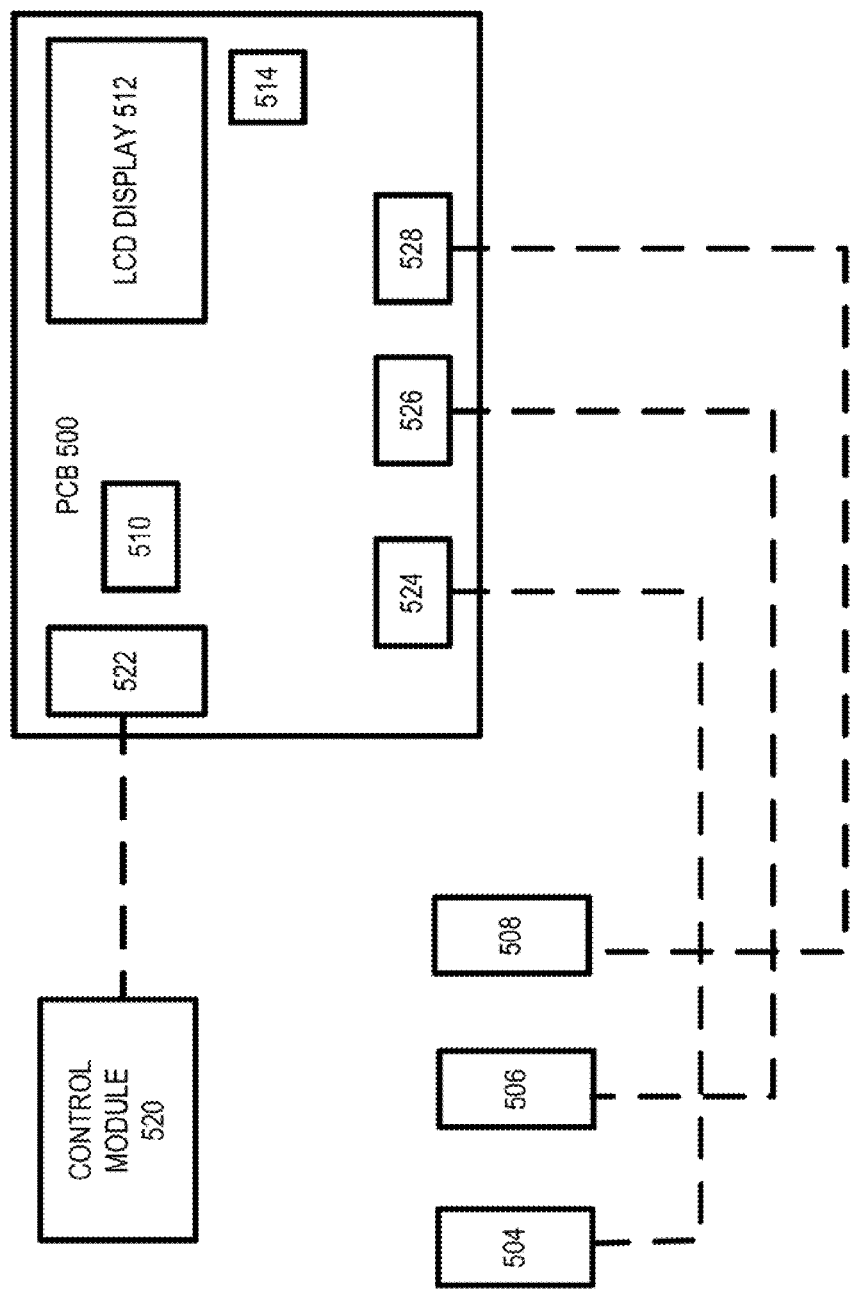
FIG. 5 shows, in an embodiment of the invention, a simple functional diagram of a printed circuit board (PCB).

FIG. 5 shows, in an embodiment of the invention, a simple functional diagram of a circuit board (PCB 500). In an embodiment, PCB 500 may be a 3 axis stepper driver board. Unlike the prior art CAM ring arrangement, only a single circuit board (such as a printed circuit board) is required to control all three stepper motors since the smaller motors require less power from the PCB 500 to drive the plunger shafts. As can be appreciated from the foregoing, although a preferred embodiment includes only a single circuit board, the direct drive arrangement may be implemented with more than one circuit board.

In an embodiment, PCB 500 may include a control module connector 522, which enables PCB 500 to communicate with a control module 520. In an embodiment, control module 520 may include a user interface computing module (such as a cluster tool controller) and a process module controller (including one with a VOIP board). The user interface computing module may be employed to enter the recipe and the process module controller may be employed to perform comparison and determine a new set point position value for the plunger arrangement when the pressure level has traversed a predetermined threshold range.

In an embodiment, PCB 500 may be configured to receive a set of instructions from control module 520. In an example, during substrate processing, if the pressure level falls outside of a predetermined threshold range, control module 520 may sends a set of instructions to PCB 500 to move the plunger arrangement to adjust the pressure level within the confinement region. The set of instructions may include step and direction signals for moving the plunger arrangement to a new set point position value.

In an embodiment, PCB 500 may include a set of plunger arrangement connectors (such as connectors 524, 526, and 528). The set of plunger arrangement connectors enables PCB 500 to communicate directly with a set of plunger arrangements (504, 506, and 508). Unlike the prior art CAM ring arrangement, PCB 500 does not relay the set of instructions to another circuit board (such as the motor driver board). Instead, PCB 500 is configured to send the set of instructions directly to the set of plunger arrangements (504, 506, and 508) via a set of plunger arrangement connectors (524, 526, and 528). As can be appreciated from the foregoing, the number of connectors may depend upon the number of plunger arrangements.

In an embodiment, PCB 500 may be configured to receive process data from the set of plunger arrangements. As aforementioned in FIGS. 4A-D, each plunger arrangement may include an encoder. The set point position value of each plunger arrangement is recorded by each encoder and is forwarded to PCB 500, in an embodiment. The set point position value of each plunger arrangement is then forwarded to control module 520. The set point position values are employed by control module 520 to calculate a new set point position value for each plunger arrangement when the pressure level within the confinement region is determined to be outside of a predetermined threshold range.

In an embodiment, PCB 500 may also be configured to provide power to the set of plunger arrangements. PCB 500 may include a set of switches 510 that may be employed to turn on and off the power to the motor of each plunger arrangement.

In an embodiment, PCB 500 may also include a set of calibration buttons 514. Set of calibration buttons 514 may be employed to calibrate the set of plunger arrangements when the plasma processing system is first initialized or after the plasma processing system has been serviced. A discussion about calibration is provided in a later figure.

PCB 500 may also include, in an embodiment, a visual display 512 (such as an LCD display). Visual display 512 may be employed to display data about plunger arrangements. In an example, visual display 512 may display the current set point position value of each plunger arrangement, the maximum differential between the set point position values of the plunger arrangements, the position of the flag in relation to the sensors, the amount of power being utilized by each plunger arrangement, and the like.

In an embodiment, visual display 512 may also be employed to display alarm warnings. In an example, if the amount of power being utilized is above a predetermined threshold value, an alarm may be displayed, thereby providing a visual notification to a technician about a potential problem. In another example, if the flag of one of the plunger arrangement breaks the optical beam of the second sensor, an alarm may be displayed to notify the technician of a potential problem.

Figure 6:
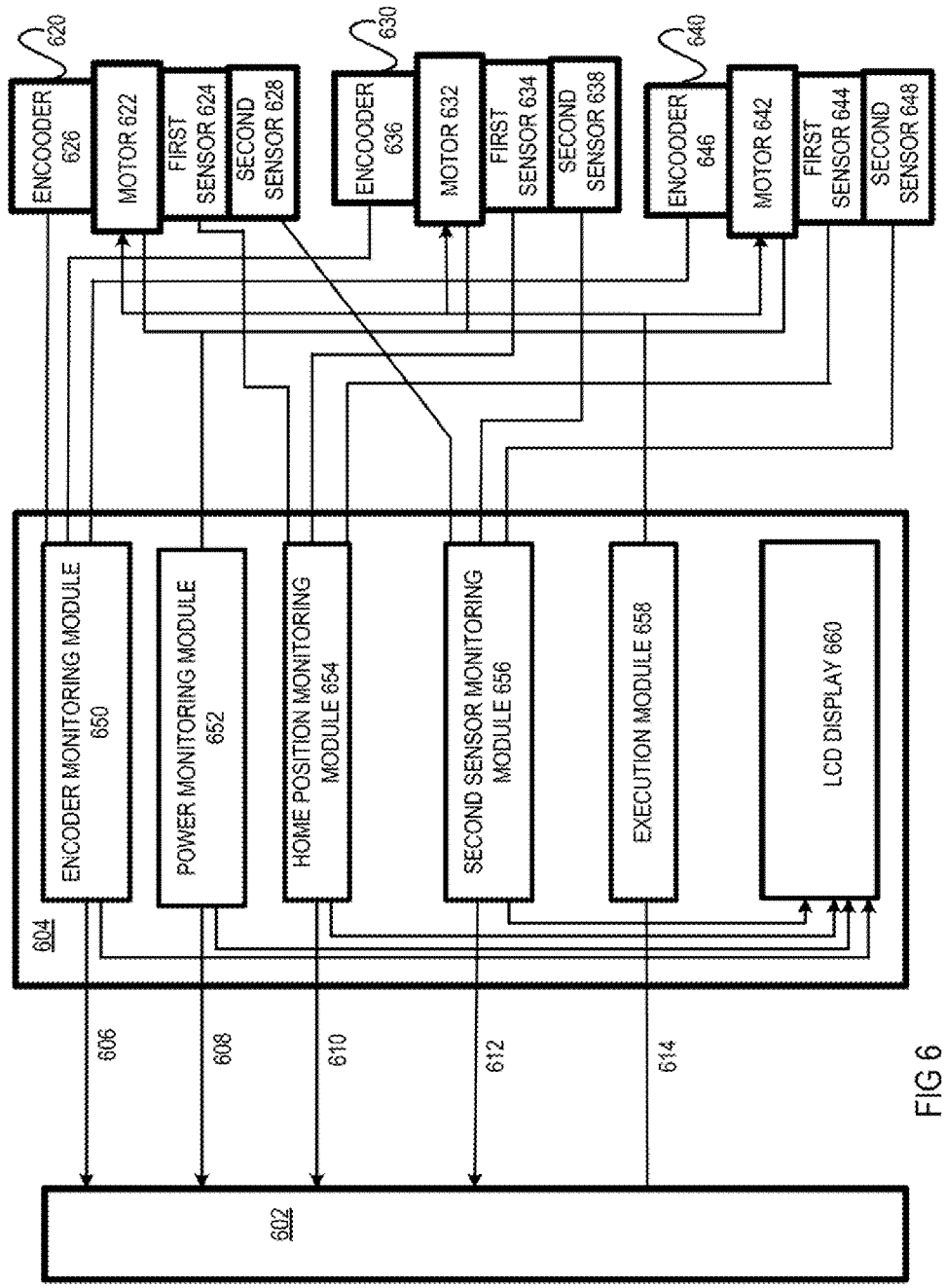
FIG. 6 shows, in an embodiment of the invention, a logic diagram of a direct drive environment.

FIG. 6 shows, in an embodiment of the invention, a logic diagram of a direct drive environment. A direct drive environment may include a board 604 (such as a printed circuit board). As aforementioned, board 604 is in communication with a control module 602 and a set of plunger arrangements (620, 630, and 640).

Board 604 has a bi-directional relationship with control module 602 and set of plunger arrangements (620, 630, and 640), in an embodiment. In an example, board 604 is configured to receive a set of instructions from control module 602 and is configured to send processing data back to control module 602. In another example, board 604 is configured to send a set of instructions to the set of plunger arrangements (620, 630, and 640) and to receive processing data from the set of plunger arrangements (620, 630, and 640).

Figure 7:
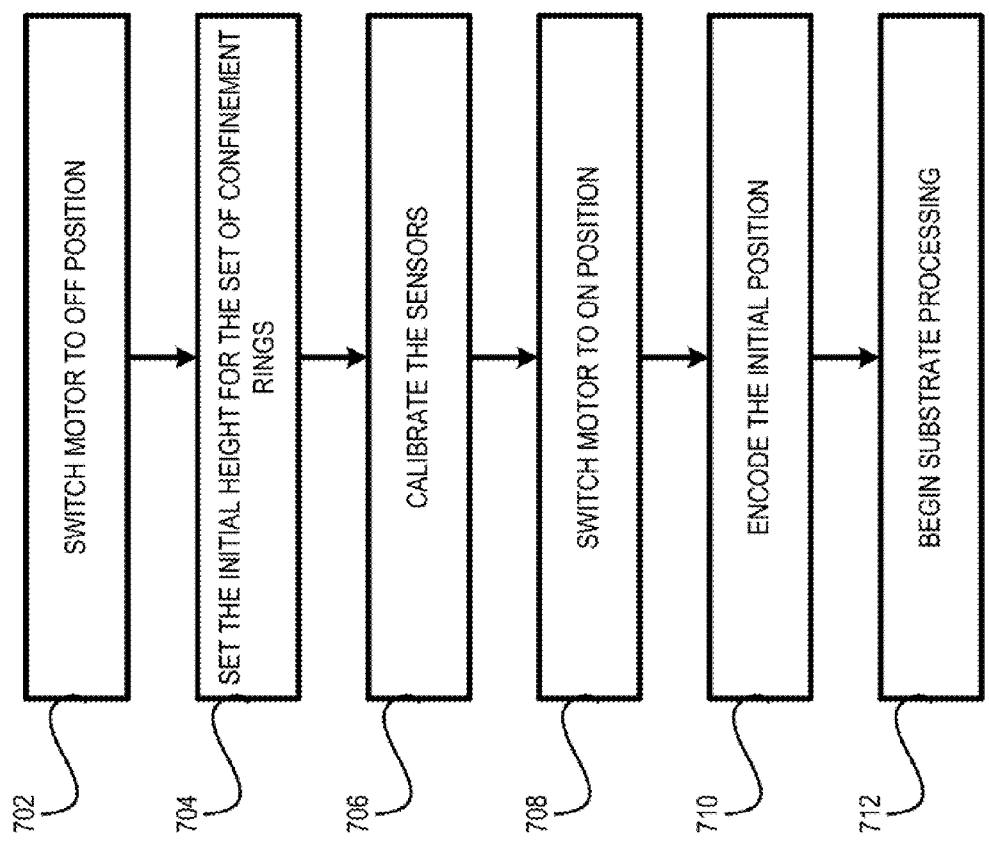
FIG. 7 shows, in an embodiment, a simple flow chart illustrating a calibration method with the direct drive arrangement.

In an embodiment, board 604 may include a home position monitoring module 654. In other words, board 604 is configured to verify the home position of each of the plunger arrangement after each plunger arrangement has been calibrated. The method for calibration may be as illustrated in FIG. 7, in an embodiment.

At a first step 702, the motor is switched to an off position. In an embodiment, the 3 axis stepper board may include switches that are configured to control the motor of each plunger arrangement. By setting each switch to an off position, the motor of each plunger arrangement is turned off.

At a next step 704, the set of confinement rings is set at an initial height. Once the motor is turned off, the initial height of the set of confinement rings may be set manually. In an embodiment, the desired gap between the bottom surface of a top plate and the top surface of the set of confinement rings may be set by employing a gauge block. The thickness of the gauge block may vary depending upon the desired initial height.

To move the set of confinement rings to the initial height, the motor shaft may be adjusted. By moving the motor shaft, the plunger shaft is moved in a vertical direction (up/down). Since the plunger shaft is hooked onto the top confinement ring, the set of confinement rings is also moved. In an embodiment, an axis knob (such as knob 426 of FIG. 4B) located above the encoder and surrounding the motor shaft may be manually rotated to manually adjust the motor shaft until the desired height of the set of confinement rings is achieved. In another embodiment, a set of calibration buttons located on the circuit board (3 axis stepper board) may be pressed to achieve the desired initial height. This step is performed for all three plunger arrangements.

At a next step 706, the sensors are calibrated. As aforementioned, the sensors include a first sensor and a second sensor. Before performing substrate processing, the plunger arrangement is set to a home position. In an embodiment, to set the home position, the motor shaft is rotated until the flag of each plunger arrangement breaks the optical beam of the first sensor. This step is performed for all three plunger arrangements.

Once the calibration has been completed, the gauge block is removed and at a next step 708, the motors are turned backed on. In an example, the switches associated with the motors (located on the circuit board) are set to an on position, thereby allowing power to flow to the motor.

Once the plunger arrangement has been calibrated, the plunger shaft is moved to a home position. At a next step 710, each encoder (such as encoders 626, 636, and 646) may be employed to record the initial set point position value of each plunger arrangement. If the differential between the set point position values of the plunger arrangements traverses a set threshold (such as zero), the sensors may need to be recalibrated.

At a next step 712, the direct drive arrangement is ready for substrate processing. Once the set point position value for each plunger arrangement has been verified, each set point position value is sent to control module 602 along a path 606, in an embodiment. The set point position value is employed in an algorithm to determine a new set point position value when the pressure level within the confinement region is outside a threshold range and the plunger arrangement has to be adjusted. Additionally or alternatively, the set point position value for each plunger arrangement may also be displayed on an LCD display 660.

The calibration method as discussed in FIG. 7 may occur in varying situations. In an example, calibration may occur when a new plasma processing system is set up or after a processing system has been serviced. For example, calibration may occur after a component part of a plunger arrangement has been replaced. In another example, calibration may also occur when the confinement rings have been replaced. As can be appreciated from the foregoing, calibration is usually not required unless a component affecting the gap between the top plate and the set of confinement rings is replaced and/or serviced.

Referring back to FIG. 6, board 604 may also include an encoder monitoring module 650, which is configured to monitor the set point position value of each plunger arrangement. In an embodiment, an encoder (such as encoders 626, 636, and 646) may be capturing the set point position value of each plunger arrangement. The set point position values are sent to board 604 for analysis. If the maximum differential of the set point position values traverses a set threshold value (which is predetermined), an alarm is sent to control module 602; Also, all three motors are stopped in order to prevent damage. In an embodiment, the set point position values and the maximum differential is also sent to control module 602 via a path 606 and/or are also displayed on LCD display 660.

Additionally, board 604 may include a power monitoring module 652 that is configured to monitor the current flowing to the motor or each plunger arrangement. In an embodiment, the current flow may be displayed on LCD display 660 for easy monitoring. If the current flow is beyond a threshold value, an alarm may be sent to control module 602 along a path 608. Also, if the current set threshold value is exceeded, all three motors of the plunger arrangements are stopped in order to prevent damage.

In an embodiment, board 604 may also include a second sensor monitoring module 656, which is configured to monitor the second sensor of each plunger arrangement. If the flag breaks the optical beam of a second sensor (such as sensors 628, 638, and 648), board 604 is configured to stop all three motors. Similar to the other steps, an alarm may also be displayed on LCD display 660 and sent to control module 602 along a path 612.

In another embodiment, board 604 may also include an execution module 658 that is configured to instruct the motor of each plunger arrangement to move to a new set point position value. Consider the situation wherein, for example, the pressure within the confinement region is above a set threshold range. Control module 602 may send a set of instructions to board 604 to move each plunger arrangement to a new set point position value in order to adjust the pressure level within the confinement region.

In an example, the set of instructions, which may include a step signal and a direction signal, may be sent along a path 614. Upon receiving the set of instructions, board 604 may instruct the stepper motors (622, 632, and 642) of each of the plunger arrangements (620, 630, and 640) to move the plunger shaft according to the step and direction signals as provided by control module 602. In an example, the motor may be instructed to move the plunger shaft upward by 5 stepper pulses.

Figure 8:
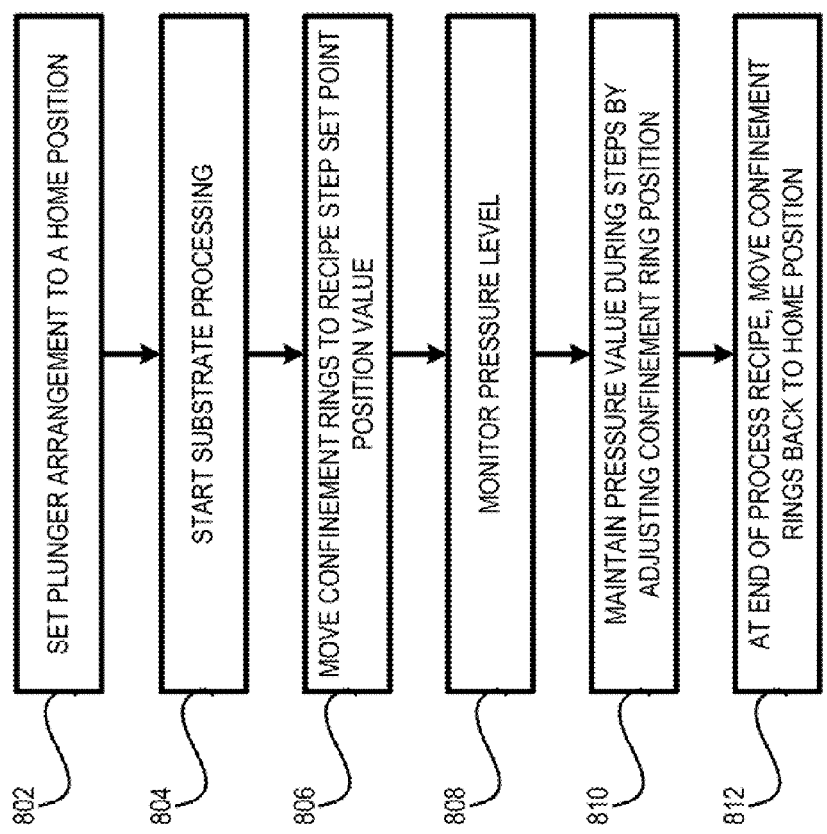
FIG. 8 shows, in an embodiment of the invention, a simple flow chart illustrating a control strategy for managing the direct drive arrangement during substrate processing.

FIG. 8 shows, in an embodiment of the invention, a simple flow chart illustrating a control strategy for managing the direct drive arrangement during substrate processing.

At a first step 802, each plunger arrangement is set to a home position. In other words, the plunger shaft is moved upward until the flag breaks the optical beam of the first sensor. Once the flag breaks the optical beam, the flag is considered to be at a home position. The home position is then sent to a control module (such as a process module controller via a circuit board).

At a next step 804, substrate processing may begin.

At a next step 806, the set of confinement rings is moved to a recipe initial set point position value. Usually, before substrate processing begins, new recipe parameters are entered and stored in a user interface computing module. The recipe parameters are then forwarded to a process module controller. The process module controller performs an algorithm based on the home position and the recipe to determine the new set point position value for each plunger arrangement. Once the new set point position value has been calculated, a set of instructions (with step and direction signals) is sent to the circuit board. The circuit board then relays the signals to the motor, which then rotates the motor shaft. The rotation of the motor shaft moves the plunger shaft, thereby causing the set of confinement rings to move to the initial set point position value.

At a next step 808, the pressure level is monitored during substrate processing. Given that conditions within the processing chamber may cause the pressure level to fluctuate, a sensor, such as a monometer, may be employed to monitor the pressure level within the confinement region. The process data about the pressure level within the confinement region may be sent to the control module for analysis.

At a next step 810, the pressure level during substrate processing is maintained by adjusting the set of confinement rings. If the control module determines that the pressure level within the confinement region is outside of an acceptable predetermined threshold range, the control module may recalculate the set point position value needed to move the confinement rings in order to adjust the pressure level back within the acceptable range. The new set point position values may be sent to the circuit board. Upon receiving the new set point position values, the circuit board may send a command to the motor of each plunger arrangement to move in a specific direction and by a specific number of stepper pulses.

At a next step 812, when the recipe step has been completed, the set of confinement rings is moved back to a home position.

As can be appreciated from the forgoing, one or more embodiments of the present invention provide for a direct drive arrangement for manipulating confinement ring positions in order to adjust the pressure level within a processing chamber environment. By simplifying the design, the direct drive arrangement occupies less physical space while still performing the function of a more complex arrangement, such as the CAM ring arrangement. With fewer mechanical/electrical parts, the direct drive arrangement is more reliable. Furthermore, the cost of ownership is minimized.

While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A direct drive arrangement for controlling pressure volume within a confinement region of a processing chamber of a plasma processing system during substrate processing, wherein said confinement region is a chamber volume surrounded by a set of confinement rings, said direct drive arrangement comprising:
   a pressure sensor configured at least for collecting pressure data about said pressure volume within said confinement region during said substrate processing;
   a plurality of plunger assemblies within a plunger arrangement, each of the plurality of plunger assemblies coupled to an uppermost ring of the set of confinement rings;
   a pair of sensors positioned on the plunger arrangement, the pair of sensors configured at least to establish a maximum distance for each plunger assembly to move vertically, wherein said pair of sensors include a home sensor and a far sensor, wherein a gap between the pair of sensors provides the maximum distance the plunger assembly may travel, and wherein at least one of the sensors of the pair of sensors may be repositioned;
   a plurality of motor assemblies disposed on an upper surface of a top plate of the processing chamber, wherein each motor assembly of said plurality of motor assemblies includes: a motor configured to move a plunger assembly of said plurality of plunger assemblies, an encoder configured to record a set point position value for each plunger assembly, and a motor shaft connecting said motor to said plunger assembly;

a plurality of couplers that are each directly connected to a motor assembly and a plunger assembly;

a set of circuits configured at least to drive said plurality of motor assemblies to move said plurality of plunger assemblies to change said pressure volume within said confinement region, provide power to said plurality of motor assemblies to move said plurality of plunger assemblies, receive a plurality of set point position values from said plurality of encoders, and feedback the plurality of set point position values from said plurality of encoders to a control module; wherein the control module is configured to receive said plurality of set point position values from said set of circuits, receive said pressure data from said pressure sensor, calculate a set of new set point position values for said plurality of plunger assemblies, and send said set of new set point position values as a set of instructions to said set of circuits, such that the control module is configured to control the plurality of motor assemblies for vertically moving a plurality of couplers that are each directly connected to a motor assembly and a plunger assembly in order to change said pressure volume within said confinement region by vertically moving said set of confinement rings.

2. The direct drive arrangement of claim 1, wherein each plunger assembly of said plurality of plunger assemblies include:

a plunger body configured to be disposed on top of an upper-facing surface of a top plate of said processing chamber, and a nose-end portion configured to be disposed below said upper-facing surface of said top plate.

3. The direct drive arrangement of claim 2, wherein said plunger body includes:

a plunger shaft, wherein the control module is configured to control the plunger shaft at least for moving said set of confinement rings, a coupler configured at least for directly connecting said motor shaft to said plunger shaft, a flag affixed to an upper part of said plunger shaft, wherein said plunger shaft is at a home position when said flag breaks a first optical beam of the home sensor, wherein an alarm is activated when said flag breaks a second optical beam of the far sensor, and a housing component configured at least for housing said plunger shaft, said coupler, said pair of sensors, and said flag.

4. The direct drive arrangement of claim 3, wherein said nose-end portion includes:

a shaft-end adapter connected to said plunger shaft, wherein said shaft-end adapter includes a ring adapter configured at least for connecting to said set of confinement rings, wherein the control module is configured to control said set of confinement rings to move in a first direction when said plunger shaft moves in said first direction, and a bushing component configured at least for guiding said plunger shaft as said plunger shaft moves vertically.

5. The direct drive arrangement of claim 4 wherein said set of circuits is a set of three-axis stepper boards.

6. The direct drive arrangement of claim 5, wherein said set of circuits includes:

a home position monitoring module configured at least verifying said home position for said plunger shaft of said each plunger assembly, an encoder monitoring module configured at least for monitoring said plurality of set point position values, a power monitoring module configured at least for monitoring current flowing to said motor of said each motor assembly, and a second sensor monitoring module configured at least for monitoring said far sensor of said each plunger assembly.

7. The direct drive arrangement of claim 6, wherein said set of circuits includes a visual display, wherein said visual display is configured for at least for displaying:

said plurality of set point position values, a maximum differential between said plurality of set point position values, power utilization, and alarm notifications.

8. The direct drive arrangement of claim 1, wherein said motor is a two stepper motor.

* * * * *